US005262979A

United States Patent [19]

Chao

[11] Patent Number: 5,262,979

[45] Date of Patent: Nov. 16, 1993

[54] OPTOELECTRONIC ASSOCIATIVE MEMORY

[75] Inventor: Tien-Hsin Chao, Valencia, Calif.

[73] Assignee: The United States of America as represented by the Administrator of the National Aeronautics and Space Administration, Washington, D.C.

[21] Appl. No.: 747,059

[22] Filed: Aug. 19, 1991

[51] Int. Cl.[5] .............................................. G11C 15/00

[52] U.S. Cl. ..................................... 365/49; 365/215; 359/561; 382/42

[58] Field of Search ......................... 365/49, 215, 234; 382/42, 14; 359/561

[56] References Cited

U.S. PATENT DOCUMENTS

| | | | |
|---|---|---|---|
| 3,949,235 | 4/1976 | Miyazaki et al. | 250/578 |
| 4,076,370 | 2/1978 | Wako | 350/3.75 |
| 4,637,055 | 1/1987 | Taylor | 382/31 |
| 4,715,683 | 12/1987 | Gregory et al. | 350/331 R |
| 4,743,097 | 5/1988 | Johnson et al. | 350/337 |
| 4,772,101 | 9/1988 | Liu | 350/337 |
| 4,804,250 | 2/1989 | Johnson | 330/162.12 |
| 4,809,340 | 2/1989 | Mersereau | 382/1 |
| 4,837,843 | 6/1989 | Owechko | 382/31 |
| 4,860,253 | 8/1989 | Owechko et al. | 365/125 |
| 4,862,406 | 8/1989 | Fisher | 364/807 |
| 4,908,702 | 3/1990 | Chao et al. | 358/93 |
| 4,924,507 | 5/1990 | Chao et al. | 382/31 |
| 4,961,615 | 10/1990 | Owechko et al. | 350/3.68 |
| 4,972,348 | 11/1990 | Ishikawa et al. | 365/49 |
| 4,974,202 | 11/1990 | Mukohzaka | 365/49 |
| 5,131,055 | 7/1992 | Chao | 365/49 X |

OTHER PUBLICATIONS

Yaser S. Abu-Mostafa & Demetri Psaltis, "Optical Neural Computers", *Scientific American*, vol. 256 No. 3, Mar., 1987, pp. 88–95.

Eung Gi Paek, Demetri Psaltis, "Optical associative memory using Fourier transform holograms", *Optical Engineering*, vol. 26, No. 5, May 1987, pp. 428–433.

Tien-Hsin Chao, "Real time optical edge enhancement using a Hughes liquid crystal light valve", *Applied Optics*, vol. 28, No. 22, Nov. 1989, pp. 4727–4731.

*Primary Examiner*—Joseph A. Popek

*Attorney, Agent, or Firm*—John H. Kusmiss; Thomas H. Jones; Guy M. Miller

[57] ABSTRACT

An associative optical memory including an input SLM in the form of an edge enhanced LCLV and a pair of memory SLMs in the form of LCTVs forms a matrix array of an input image which is cross correlated with a matrix array of stored images. The correlation product is detected and non-linearly amplified to illuminate a replica of the stored image array to select the stored image correlating with the input image. The LCLV is edge enhanced by reducing the bias frequency and voltage and rotating its orientation. The edge enhancement and non-linearity of the photodetection improves the orthogonality of the stored images. The illumination of the replicate stored image provides a clean stored image, uncontaminated by the image comparison process.

17 Claims, 1 Drawing Sheet

OPTOELECTRONIC ASSOCIATIVE MEMORY

ORIGIN OF THE INVENTION

The invention described herein was made in the performance of work under a NASA contract, and is subject to the provisions of Public Law 96-517 (35 USC 202) in which the Contractor has elected not to retain title.

TECHNICAL FIELD

The present invention relates to optoelectronic associative memories and, in particular, to an optical implementation of a spatial light modulator based Hopfield type optical associative memory.

BACKGROUND OF THE INVENTION

Techniques for image recognition and comparison using optical associative memory configurations have been proposed, such as the one known as the Hopfield type described in the publication by J. J. Hopfield, "Neural networks and Physical systems with emergent collective computational abilities", *Proc. Natl. Acad. Sci. U.S.A.* 79, 2554 (1984).

It is known that the Hopfield associative memory model is more effective for orthogonal memory images. However, real-world images, such as cars or airplanes, usually contain lots of common parts so that the associative recall of a complete image using a corrupted partial image input is relatively difficult.

What is needed is an implementation of a Hopfield type associative memory that can improve the success rate of associative optical recall even with partial and/or corrupted input images.

BRIEF STATEMENT OF THE INVENTION

The preceding and other shortcomings of the prior art are addressed and overcome by the present invention that provides, in a first aspect, a method for selectively retrieving a stored image from a plurality of stored images by displaying an input image with a first SLM, forming a first matrix array including replications of the input image on a second SLM, forming a second matrix array including stored images on the second SLM, forming a third matrix array of stored images on a third SLM related to the second matrix array, and selectively illuminating the third SLM to select an image in the third matrix array in response to correlation in the second SLM between a corresponding image in the second matrix array and the input image.

In a further aspect, the present invention provides a system for selectively retrieving a stored image from a plurality of stored images having a first SLM for displaying an input image, a second SLM, means for forming a first matrix array on the second SLM including replications of the input image displayed on the first SLM, means for forming a second matrix array including stored images on the second SLM, a third SLM, means for forming a third matrix array of stored images on the third SLM related to the second matrix array, and means for selectively illuminating the third SLM to select an image in the third matrix array in response to correlation in the second SLM between a corresponding image in the second matrix array and the input image.

These and other features and advantages of this invention will become further apparent from the detailed description that follows which is accompanied by a set of drawing figure(s). In the figures and description, numerals indicate the various features of the invention, like numerals referring to like features throughout both the drawings and the description.

BRIEF DESCRIPTION OF THE DRAWING(S)

FIG. 1 is a functional block diagram of a spatial light modulator based optoelectronic associative memory according to the present invention.

DETAILED DESCRIPTION OF THE INVENTION

Figure 1:
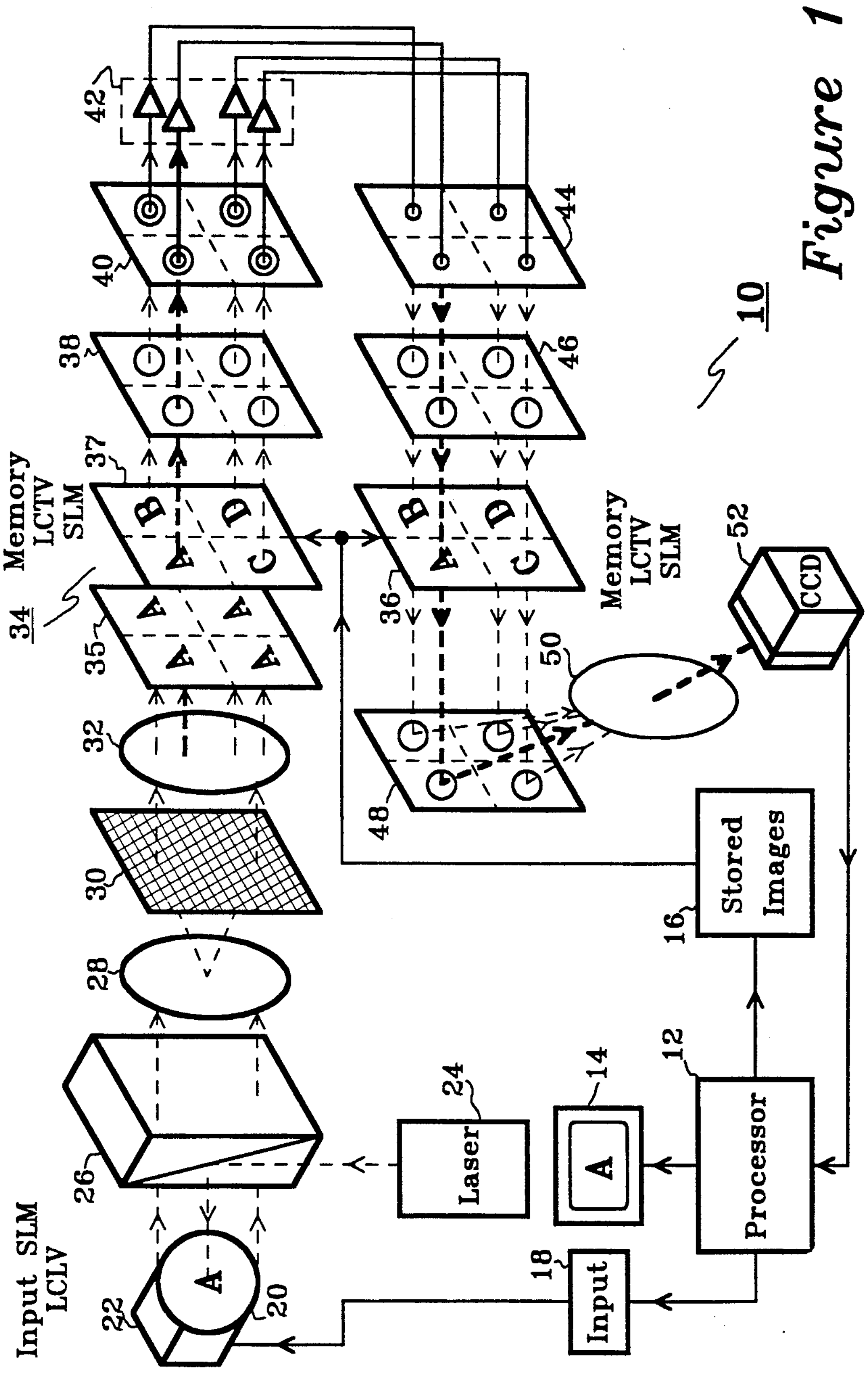

FIG. 1 is a functional block diagram of spatial light modulator—or SLM—based optoelectronic associative memory 10 according to the present invention. Associative memory 10 includes processor 12, monitor 14 and memory 16 all of which may conveniently be parts of a conventional microprocessor computer system. The stored images are contained in memory 16 and are displayed for comparison, as will be described in more detail below, under the control of processor 12.

The object image input is provided by input subsystem 18 which may be any convenient source of the image to be recognized. A dotted line relationship between input subsystem 18 and processor 12 is shown to indicate that in some embodiments, the object image to be analyzed and recalled may be stored in memory 16 and provided by input subsystem 18 under the control of processor 12.

The following simplified overview of the operation of associative memory 10 will first be presented for clarity of understanding. A more detailed description of the complete system will then be presented.

The image to be analyzed is retrieved from input subsystem 18 and an edge enhanced version thereof is replicated to form a matrix array of identical images. A similar matrix array of memory images is formed from stored images retrieved from memory 16 and superimposed upon the matrix of input images to optically correlate them to determine the most accurate match, if any.

The difference in light values between accurate and inaccurate matches resulting from the optical cross correlation is exaggerated with a non-linear photodetection system and then used to control a light source array to illuminate a second, related or identical matrix of memory images to selectively project the corresponding stored image for further processing, such as by redisplay on monitor 14.

In particular, the input or object image is retrieved under the control of processor 12 from any convenient source, such as memory 16. The input image may be only a partial image and/or a corrupted image. The operation of associative memory 10 will permit the retrieval of a complete and uncorrupted version of the input image if such a version is stored in the stored images within memory 16 and can be selected by comparison with the input image.

For convenience of pictorial display and explanation, the object or input image is shown in FIG. 1 as the letter "A" although in actual operation the image represented in the FIGURE as input image A might be a partial and/or corrupted image of an enemy airplane or any other image for which comparison by optical associative memory is required.

The object image is applied by input subsystem 18 to a suitable gray scale SLM display device or subsystem which, as shown in FIG. 1, may conveniently be a liquid crystal light valve—or LCLV—such as LCLV 20, driven by a cathode ray tube—or CRT—such as CRT 22. Input image A is shown in FIG. 1 on the face of LCLV 20.

In an actual implementation of associative memory 10, a XYTRON CRT was utilized as CRT 22 and a Hughes CdS LCLV was utilized as LCLV 20 to form an input SLM. The use of an LCLV, such as the Hughes CdS LCLV, as the input SLM is particularly advantageous when the LCLV is used in a real time edge enhancement mode as described in greater detail below.

A source of coherent light from a low power laser, such as laser 24, is applied to LCLV 20 by reflection from polarizing beam splitter 26. Laser 24 may conveniently be a 632.8 nm He-Ne laser. The light then reflected from LCLV 20 through polarizing beam splitter 26 includes input image A and is focussed by optical lens 28 on a device for forming a matrix of such images, such as binary diffraction grating optics 30. Diffraction grating optics 30 serves to form a matrix of M rows and N columns of identical replications of input image A. For the purposes of this illustration, M is shown as equal to N which is equal to 2, so that input image A is replicated four times. In a practical implementation of associative memory 10 in accordance with this invention, it may well be convenient for M and N to be substantially larger numbers.

The matrix output of diffraction grating optics 30 is applied by optical lens 32 to the first of a pair of optical memories, such as liquid crystal television—or LCTV—SLMs 34 and 36. In particular, the matrix output from diffraction grating optics 30 is applied to one surface, separately identified for clarity as first surface 35, of LCTV SLM 34. That is, a matrix consisting of replications of input image A—hereafter called input image matrix AAAA—is applied to LCTV SLM 34.

In addition, a different matrix of images, shown in the FIGURE as a 2×2 matrix consisting of the letters A, B, C, and D and referred to hereinafter as stored image matrix ABCD, is formed in LCTV SLMs 34 and 36. For clarity of explanation and depiction, stored image matrix ABCD is shown as being formed on separated second surface 37 of LCTV SLM 34 but, in actual practice, input image matrix AAAA is superimposed on stored image matrix ABCD in LCTV SLM 34. The utilization of stored image matrix ABCD formed in LCTV SLM 36 will be described below.

Each LCTV SLM 34 and 36 may conveniently be a model 3ML100 Sharp TFT active matrix LCTV. The size and configuration of the matrices formed in LCTV SLMs 34 and 36 are dependent on the size and configuration of the input matrix. That is, stored image matrix ABCD should have the same number of elements, of about the same size and relative position, as input image matrix AAAA. As noted above, the matrices shown in the FIGURE are all 2×2 matrices for convenience.

Stored image matrix ABCD is formed in LCTV SLMs 34 and 36 under the control of processor 12 from images stored in memory 16. If the number of stored images to be compared to input image A is greater than the resolution of stored image matrix ABCD, multiple matrices of stored images may be sequentially processed. Alternately, the association of one of a series of stored images to input image A may be used as part of the selection criteria for the selection of stored images to be used in a subsequent stored image matrix.

In any event, the superposition of input image matrix AAAA and stored image matrix ABCD on or in LCTV SLM 34 acts as a form of image association or correlation as part of the process of image recognition by comparison. If a stored image in stored image matrix ABCD is substantially similar to one of the replications of input image A in input image matrix AAAA, the light transmitted through LCTV SLM 34 at that image location originating from laser 24 will be substantially greater than the light transmitted through LCTV SLM 34 at all other image locations.

In the example shown in the FIGURE, input image A in the upper left corner of input image matrix AAAA shown on first surface 35 will be transmitted faithfully through LCTV SLM 34 at the stored image of the letter A in the upper left hand corner of stored image matrix ABCD shown on second surface 37. This ray of light will be substantially brighter than the rays resulting from the superposition of input image A of other stored images, such as the letters B, C or D, at other locations of stored image matrix ABCD.

The light transmitted through LCTV SLM 34 is applied by lenslet array 38 to photodetector array 40. For simplicity, and to emphasize the discrimination of the location of the matrices in which corresponding images are applied, the light ray resulting from the correlation of input image A and stored image A is shown as a thicker ray, although the partial cross correlation of input image A with other stored images in stored image matrix ABCD may result in lower value light rays also being applied to photodetector array 40.

The output of each photodetector in photodetector array 40 is applied to non-linear amplifier subsystem 42 which drives light source matrix array 44. As will be described below in greater detail, the light source in light source matrix array 44 in the matrix location in which there is substantial correlation between input and stored images occurred in LCTV SLM 34 will be illuminated more brightly than those for other locations. Light from light source matrix array 44 is then applied by lenslet array 46 to LCTV SLM 36.

As noted above, stored image matrix ABCD is applied to LCTV SLM 36 in the same manner as it is applied to LCTV SLM 34. In this way, the light resulting from positive correlation between input and stored images is then used to illuminate a duplicate of the stored image to complete the associative recall process. The stored image of the letter A in the upper left hand corner of stored image matrix ABCD is thereby illuminated by the appropriate light source in light source matrix array 44 more strongly than the other stored images in that array so that the image provided for further processing more closely resembles the input image.

As shown in the FIGURE, the corresponding image, if one exists, is applied by the strong illumination of the corresponding location to mirror array 48 together with less strongly illuminated images which did not correlate was well with the input image. Mirror array 48 is an array of individual mirrors, each corresponding to a specific location of the matrix array of LCTV SLM 36 and pivoted or tilted so that a light ray from each such location is imaged by optical lens 50 to a predetermined central location on an image photodetector, such as charge couple detector—or CCD—camera 52. CCD camera 52 then provides the image received from mirror array 48 to processor 12 for thresholding and feedback operations.

In many cases, further iteration of the associative memory loop is used to further enhance the retrieved image, especially for partial and/or corrupted input images. Processor 12 provides a thresholding function which selects or identifies the memory image array applied to LCTV SLM 36 that provides a signal above a predetermined threshold indicating a predetermined degree of correlation between one element of that array and the input image.

Once the threshold level has been achieved, the input image in input subsystem 18 is replaced by the output of CCD camera 52 under the control of processor 12 and reapplied by CRT 22 to LCLV 20 for re-correlation with stored image matrix ABCD. The output of CCD camera 52 which exceeds the threshold value as determined by processor 12 is also displayed of monitor 14.

The image then applied to CCD camera 52 will, of course, show enhanced correlation with input image A. Further iterations may be utilized to provide additional image enhancement until the image displayed on monitor 14 is substantially an uncontaminated version of the one of the images stored in memory 16.

In summary, the operation of associative memory 10 provides for the comparison of an input image, which may be only a partial and/or corrupted image, with multiple stored images to select and then present a clean copy of a corresponding image if available.

As noted above, associative optical memories such as the Hopfield type model described herein, are more effective for orthogonal memory images. To enhance the discrimination capabilities of associative memory 10, LCLV 20 may conveniently be operated in an edge enhancement mode and amplifier subsystem 42 may be implemented to provide a non-linear transfer function between light intensities detected by photodetector array 40 and the strength of illumination generated by the individual sources in light source matrix array 44.

In particular, the operation of a particular LCLV in an edge enhancement mode is described in detail in an article by the inventor hereof entitled "Real time optical edge enhancement using a Hughes liquid crystal light valve", published in *APPLIED OPTICS*, Vol. 28, No. 22, Nov. 15, 1989, the text of which is incorporated herein by this reference.

In the preferred embodiment shown in the FIGURE, LCLV 20 is an edge enhanced spatial light modulator configured from a Hughes CdS liquid crystal light valve operated at a relatively low bias frequency, on the order of about 500 Hz to about 2 kHz, and a relatively low bias voltage, on the order of about 5 to about 7 volts rms. The nominal bias frequency and voltages are 10 kHz and 10 volts rms. In addition, the orientation of LCLV 20 may be rotated counterclockwise, as observed from the readout side, in the range of about 10° to about 30°.

With regard now to the operation of amplifier subsystem 42, non-linear amplifiers, such as operational amplifiers operated in a non-linear mode, may be used to further enhance the discrimination capabilities of associative memory system lo by non-linearly increasing the intensity of illumination generated by the corresponding light source in light source matrix array 44 when compared to the intensity of light detected at the various matrix locations by photodetector array 40.

While this invention has been described with reference to its presently preferred embodiment, its scope is not limited thereto. Rather, such scope is only limited insofar as defined by the following set of claims and includes all equivalents thereof.

What is claimed is:

1. A method for selectively retrieving a stored image from a plurality of stored images comprising the steps of:

displaying an input image with a first spatial light modulator;

forming a first matrix array including replications of the input image on a second spatial light modulator;

forming a second matrix array including a plurality of stored images at least one of which may correlate with said input image, said second matrix array being formed on the second spatial light modulator;

forming a third matrix array of at least some of said stored images on a third spatial light modulator; and selectively illuminating the third matrix array to form an output image in response to correlation in the second spatial light modulator between one of said plurality of stored images and one of said replications of the input image.

2. The method of claim 1 wherein the step of displaying the input image further comprises the step of:

displaying the input image on a liquid crystal light valve; and adjusting the liquid crystal light valve to provide edge enhancement of the input image.

3. The method of claim 2 wherein the liquid crystal light valve includes an adjustable bias frequency and an adjustable bias voltage and the step of adjusting the liquid crystal light valve to provide edge enhancement of the input image further comprises the steps of:

reducing the bias frequency; and reducing the bias voltage of the liquid crystal light valve.

4. The method of claim 2 wherein the liquid crystal light valve includes an adjustable bias frequency and the step of adjusting the liquid crystal light valve to provide edge enhancement of the input image further comprises the step of:

reducing the bias frequency of the liquid crystal light valve to the range of about 500 Hz to about 2 kHz.

5. The method of claim 2 wherein the liquid crystal light valve includes an adjustable bias voltage and the step of adjusting the liquid crystal light valve to provide edge enhancement of the input image further comprises the step of:

reducing the bias voltage of the liquid crystal light valve to the range of about 5 to about 7 volts.

6. The method of claim 2 wherein the liquid crystal light valve has an initial orientation and the step of adjusting the liquid crystal light valve to provide edge enhancement of the input image further comprises the step of:

adjusting the orientation of the liquid crystal light valve in the range of about 10° to about 30°.

7. The method of claim 2 wherein the step of selectively illuminating the third spatial light modulator to select an image in the third matrix array further comprises the steps of:

detecting correlation between the first and second matrix arrays with an array of photodetectors; and illuminating an array of light sources in response to the detected correlations to selectively apply light to the third spatial light modulator.

8. The method of claim 7 wherein the step of illuminating the array of light sources further comprises the step of:

non-linearly amplifying outputs of the photodetector array to drive the array of light sources.

9. The method of claim 1 further comprising the steps of:

directing the illumination applied to the third matrix array to a mirror array in which mirrors corresponding to each matrix array location reflect images to a central location; and focussing the images applied to the central location onto an image detector.

10. A system for selectively retrieving a stored image from a plurality of stored images comprising:

a first spatial light modulator for displaying an input image;

a second spatial light modulator;

means for forming a first matrix array on the second spatial light modulator including replications of the input image displayed on the first spatial light modulator;

means for forming a second matrix array including a plurality of stored images on the second spatial light modulator, said second matrix array being superimposed upon said first matrix array for correlation therewith;

a third spatial light modulator;

means for forming a third matrix array including at least some of said plurality of stored images, said third matrix array being formed on the third spatial light modulator;

means for detecting a correlation above a predetermined threshold value between images in said first and second matrix arrays; and means for selectively illuminating the third spatial light modulator to form an output image related to said input image in response to a detected correlation.

11. The system of claim 10 wherein the first spatial light modulator is a liquid crystal light valve, further comprising:

means for adjusting the liquid crystal light valve to provide edge enhancement of the input image.

12. The system of claim 11 wherein the liquid crystal light valve includes an adjustable bias frequency and an adjustable bias voltage and means for adjusting the liquid crystal light valve to provide edge enhancement of the input image further comprises:

means for reducing the bias frequency; and means for reducing the bias voltage.

13. The system of claim 11 wherein the liquid crystal light valve includes an adjustable bias frequency and means for adjusting the liquid crystal light valve to provide edge enhancement of the input image further comprises:

means for reducing the bias frequency of the liquid crystal light valve to the range of about 500 Hz to about 2 kHz.

14. The system of claim 11 wherein the liquid crystal light valve includes an adjustable bias voltage and means for adjusting the liquid crystal light valve to provide edge enhancement of the input image further comprises:

means for reducing the bias voltage of the liquid crystal light valve to the range of about 5 to about 7 volts.

15. The system of claim 11 wherein the liquid crystal light valve has an initial orientation and the means for adjusting the liquid crystal light valve to provide edge enhancement of the input image further comprises:

means for adjusting the orientation of the liquid crystal light valve in the range of about 10# to about 30#.

16. The system of claim 11 wherein the means for selectively illuminating the third spatial light modulator to select an image in the third matrix array further comprises:

photodetector means for detecting correlation between the first and second matrix arrays;

non-linearly amplifying means for amplifying the outputs of the photodetector means for illuminating the third spatial light modulator.

17. The system of claim 10 further comprising:

a mirror array responsive to the third spatial light modulator in which mirrors corresponding to each matrix array location reflect images to a central location; and means for detecting the images applied to the central location.

* * * * *